(12) United States Patent
Chang et al.

(10) Patent No.: US 9,660,060 B2
(45) Date of Patent: May 23, 2017

(54) THIN FILM TRANSISTOR AND FABRICATING METHOD THEREOF

(71) Applicant: Au Optronics Corporation, Hsinchu (TW)

(72) Inventors: Chih-Pang Chang, Taipei (TW); Tzu-Yin Kuo, Nantou County (TW)

(73) Assignee: Au Optronics Corporation, Hsinchu (TW)

( * ) Notice: Subject to any disclaimer, the term of this patent is extended or adjusted under 35 U.S.C. 154(b) by 36 days.

(21) Appl. No.: 14/314,044

(22) Filed: Jun. 25, 2014

(65) Prior Publication Data
US 2015/0001534 A1 Jan. 1, 2015

(30) Foreign Application Priority Data

Jun. 27, 2013 (TW) .............................. 102122974 A

(51) Int. Cl.
*H01L 29/66* (2006.01)
*H01L 29/786* (2006.01)

(52) U.S. Cl.
CPC .... *H01L 29/66969* (2013.01); *H01L 29/7869* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 7,566,904 B2 | 7/2009 | Ishii | |
| 7,585,698 B2 | 9/2009 | Ishii | |
| 7,977,169 B2 | 7/2011 | Hirao et al. | |
| 8,609,460 B2 | 12/2013 | Liu et al. | |
| 8,791,032 B2 | 7/2014 | Park et al. | |
| 9,231,111 B2 * | 1/2016 | Yamazaki | H01L 29/7869 |
| 2007/0187678 A1 | 8/2007 | Hirao et al. | |
| 2008/0305575 A1 | 12/2008 | Ishii | |
| 2010/0006834 A1 | 1/2010 | Kim et al. | |
| 2010/0140614 A1 | 6/2010 | Uchiyama et al. | |
| 2011/0108835 A1 | 5/2011 | Kim et al. | |

(Continued)

FOREIGN PATENT DOCUMENTS

| | | |
|---|---|---|
| CN | 101128940 | 2/2008 |
| CN | 101310371 | 11/2008 |

(Continued)

*Primary Examiner* — Robert Carpenter
(74) *Attorney, Agent, or Firm* — Jianq Chyun IP Office

(57) ABSTRACT

A thin film transistor and a fabricating method thereof are provided. The thin film transistor includes a semiconductor stacked layer, an insulating layer, a gate, a dielectric layer, a source and a drain. The semiconductor stacked layer includes a first metal oxide semiconductor layer and a second metal oxide semiconductor layer disposed on the first metal oxide semiconductor layer. A resistance value of the first metal oxide semiconductor layer is less than a resistance value of the second metal oxide semiconductor layer. The insulating layer is disposed on the semiconductor stacked layer. The gate is disposed on the insulating layer. The dielectric layer covers the gate, wherein the dielectric layer has a plurality of contact openings. The source and the drain are disposed on the dielectric layer, and filled into the contact openings to electrically connect with the semiconductor stacked layer.

14 Claims, 14 Drawing Sheets

(56) References Cited

U.S. PATENT DOCUMENTS

2011/0315980 A1* 12/2011 Kim ................. H01L 29/26
                                                        257/43
2012/0061661 A1   3/2012 Liu et al.
2012/0313114 A1  12/2012 Park et al.
2013/0009148 A1   1/2013 Yamazaki
2014/0299860 A1  10/2014 Park et al.

FOREIGN PATENT DOCUMENTS

| TW | 201137989 | 11/2011 |
| TW | 201212230 | 3/2012 |
| TW | 201250356 | 12/2012 |
| TW | 201310645 | 3/2013 |

* cited by examiner

THIN FILM TRANSISTOR AND FABRICATING METHOD THEREOF

CROSS-REFERENCE TO RELATED APPLICATION

This application claims the priority benefit of Taiwan application serial no. 102122974, filed on Jun. 27, 2013. The entirety of the above-mentioned patent application is hereby incorporated by reference herein and made a part of this specification.

BACKGROUND OF THE INVENTION

Field of the Invention

The invention relates to a transistor and a fabricating method thereof, and more particularly, to a thin film transistor and a fabricating method thereof.

Description of Related Art

Accompanied by the significant progress in information technologies, display devices with various specifications have been applied in screens of all sorts of consumer electronic products including mobile phones, notebook computers, digital cameras and personal digital assistants. Among these displays, liquid crystal display (LCD) and organic light emitting diode (OLED) have become mainstream products in the market owing to the advantages including light weight and low power consumption. Manufacture process of LCD and OLED includes disposing an array of semiconductor devices including a thin film transistor (TFT).

With resolution of a display getting higher, a size of the thin film transistor is getting smaller accordingly. A thin film transistor with a self-align top-gate structure has been developed to solve problems such as limitations to alignment during a lithography process, and parasitic capacitance of gate-to-drain and gate-to-source (i.e., Cgd and Cgs). However, in conventional art, indium gallium zinc with low resistance is provided by sputtering entire surface of an aluminum thin film with a thickness controlled at approximately 5 nanometers, followed by performing an oxidation reaction to an indium gallium zinc oxide (IGZO) with high resistance and the aluminum thin film in an annealing process. Accordingly, in conventional art, problems such as the thickness uniformity of the aluminum thin film and the completion of oxidation reaction can result in the malfunction of device.

SUMMARY OF THE INVENTION

The invention is directed to a thin film transistor and a fabricating method thereof, in which the thin film transistor with the self-align top-gate structure has a better device characteristic.

The invention provides a thin film transistor including a semiconductor stacked layer, an insulating layer, a gate, a dielectric layer, a source and a drain. The semiconductor stacked layer includes a first metal oxide semiconductor layer and a second metal oxide semiconductor layer disposed on the first metal oxide semiconductor layer. A resistance value of the first metal oxide semiconductor layer is less than a resistance value of the second metal oxide semiconductor layer. The insulating layer is disposed on the semiconductor stacked layer. The gate is disposed on the insulating layer. The dielectric layer covers the gate, wherein the dielectric layer has a plurality of contact openings. The source and the drain are disposed on the dielectric layer, and filled into the contact openings to electrically connect with the semiconductor stacked layer.

The invention further provides a fabricating method of thin film transistor which includes the following steps. A semiconductor stacked layer is formed on the substrate. The semiconductor stacked layer includes a first metal oxide semiconductor layer and a second metal oxide semiconductor layer disposed on the first metal oxide semiconductor layer. A resistance value of the first metal oxide semiconductor layer is less than a resistance value of the second metal oxide semiconductor layer. An insulating layer is formed on the semiconductor stacked layer. A gate is formed on the insulating layer. A dielectric layer is formed on the gate, wherein the dielectric layer has a plurality of contact openings. A source and a drain are formed on the dielectric layer, wherein the source and the drain fill into the contact openings to electrically connect with the semiconductor stacked layer.

Based on above, in the thin film transistor and the fabricating method thereof, the semiconductor stacked layer includes a first metal oxide semiconductor layer and a second metal oxide semiconductor layer disposed on the first metal oxide semiconductor layer, in which a resistance value of the first metal oxide semiconductor layer is less than a resistance value of the second metal oxide semiconductor layer. In other words, the thin film transistor has two metal oxide semiconductor layers which are sequentially stacked, and the resistance value of the metal oxide semiconductor layer on lower layer is less than the resistance value of the metal oxide semiconductor layer on upper layer. Furthermore, the thin film transistor with the self-align top-gate structure of the invention can be complete by using only a photolithography process without sputtering entire surface of the aluminum thin film and the oxidation reaction as in the conventional art. Accordingly, the thin film transistor with the self-align top-gate structure and the fabricating method thereof according to the invention can solve the problems in the conventional art such as the thickness uniformity of the aluminum thin film and the completion of oxidation reaction, such that a better device characteristic can be provided.

To make the above features and advantages of the disclosure more comprehensible, several embodiments accompanied with drawings are described in detail as follows.

DESCRIPTION OF THE EMBODIMENTS

FIGS. 1A to 1E are schematic cross-sectional views illustrating a fabricating method of a thin film transistor 100 according to a first embodiment of the invention.

Figure 1A:
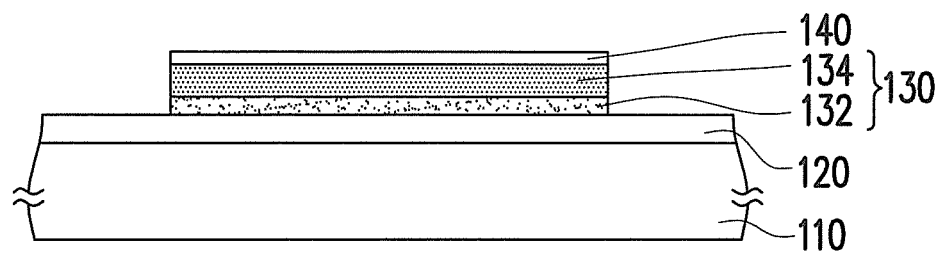
FIGS. 1A to 1E are schematic cross-sectional views illustrating a fabricating method of a thin film transistor according to a first embodiment of the invention.

Referring to FIG. 1A, first, a substrate 110 is provided. A material of the substrate 110 is, for example, a glass, a quartz, an organic polymer or a metal, etc. Subsequently, a buffer layer 120 is formed on the substrate 110, and a material of the buffer 120 is, for example, an oxide. However, the invention is not limited thereto. In other embodiments of the invention, as long as the substrate 110 can tolerate a subsequent photolithography process, the buffer layer 120 can be omitted. Thereafter, a first metal oxide semiconductor material (not illustrated) and a second metal oxide semiconductor material (not illustrated), a protective material are sequentially formed on the substrate 110 on which the buffer layer 120 is already formed. Subsequently, the first metal oxide semiconductor material and the second metal oxide semiconductor material, the protective material are patterned to form a semiconductor stacked layer 130 and a protection 140. Above patterning process is completed by, for example, performing a photolithography and an etching processes. The semiconductor stacked layer 130 includes a first metal oxide semiconductor layer 132 and a second metal oxide semiconductor layer 134 disposed on the first metal oxide semiconductor layer 132, in which a resistance value of the first metal oxide semiconductor layer 132 is less than a resistance value of the second metal oxide semiconductor layer 134. The first metal oxide semiconductor layer 132 includes, for example, indium tin zinc oxide (ITZO), indium gallium zinc (IGZO) or zinc oxide (ZnO), and the second metal oxide semiconductor layer 134 includes, for example, indium gallium zinc (IGZO) or silicon-containing indium gallium zinc (Si-IGZO). The protection layer 140 not only prevents the metal oxide semiconductor material from contacting a photoresistor directly, but also facilitates in alignment during a lithography process. A material of the protection layer 140 is, for example, silicon oxide, silicon nitride, silicon oxynitride or other suitable insulating materials.

Figure 1B:
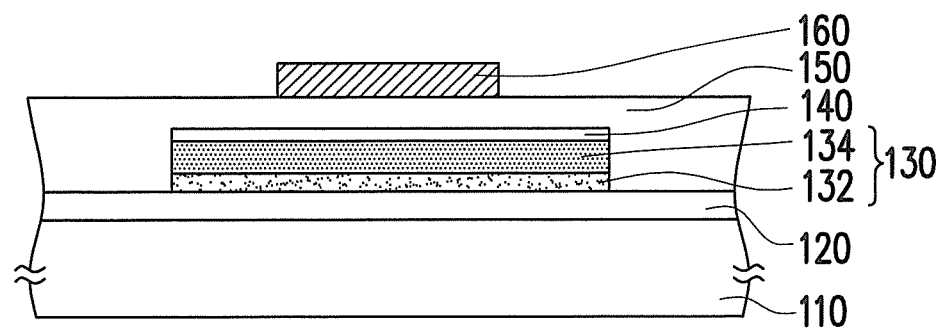

Referring to FIG. 1B, thereafter, an insulating material 150 is formed above the patterned second metal oxide semiconductor material (i.e., the second metal oxide semiconductor layer 134). More specifically, the insulating material 150 covers the semiconductor stacked layer 130 and the protection layer 140. Subsequently, a gate 160 is formed on the insulating material 150. The gate 160 is formed by, for example, depositing a gate material (not illustrated), and followed by performing a photolithography process and an etching process to pattern the gate material.

Figure 1C:
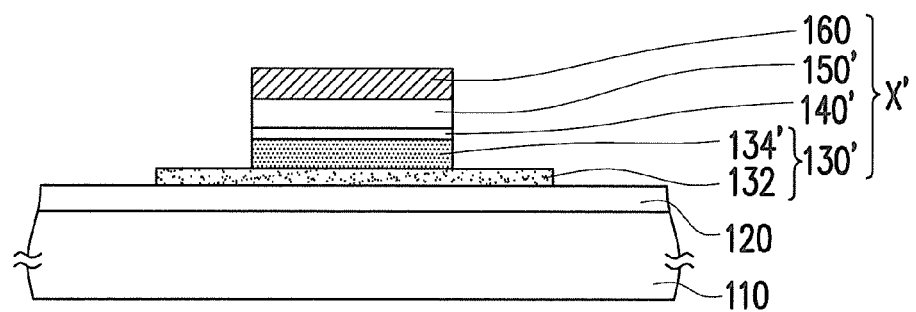

Referring to FIG. 1C, subsequently, the insulating material 150, the protection layer 140 and the patterned second metal oxide semiconductor material (i.e., the second metal oxide semiconductor layer 134) are patterned by using the gate 160 as an etching mask, so as to partially expose the first metal oxide semiconductor material, thereby forming a semiconductor stacked layer 130'. The semiconductor stacked layer 130' includes the first metal oxide semiconductor layer 132 and a second metal oxide semiconductor layer 134' (i.e., the second metal oxide semiconductor layer 134 being patterned) disposed on the first metal oxide semiconductor layer 132. Further, a protection layer 140' and an insulating layer 150' (i.e., the protection layer 140 being patterned and the insulating material 150 being patterned) are formed on the semiconductor stacked layer 130', and the gate 160 is formed on the insulating layer 150'. Therein, the semiconductor stacked layer 130', the protection layer 140', the insulating layer 150' and the gate 160 are a stacked layer X'. A material of the insulating layer 150' is, for example, silicon oxide, silicon nitride or silicon oxynitride.

Figure 1D:
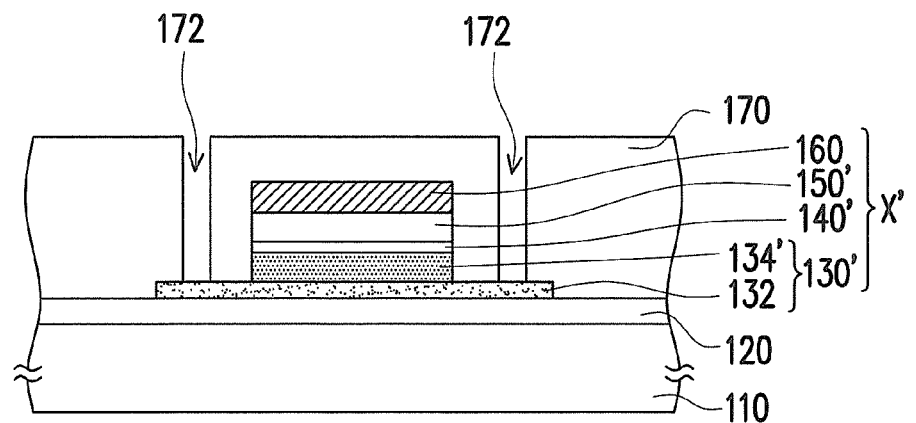

Referring to FIG. 1D, thereafter, a dielectric layer 170 is formed on the stacked layer X', in which the dielectric layer 170 has a plurality of contact openings 172. More specifically, the dielectric layer 170 completely covers an upper side and a lateral side of the stack layer X' and the buffer layer 120 being exposed, and the first metal oxide semiconductor layer 132 of the semiconductor stacked layer 130' is partially exposed by the contact openings 172 in the dielectric layer 170. A material of the dielectric layer 170 is, for example, silicon oxide, silicon nitride or silicon oxynitride.

Figure 1E:
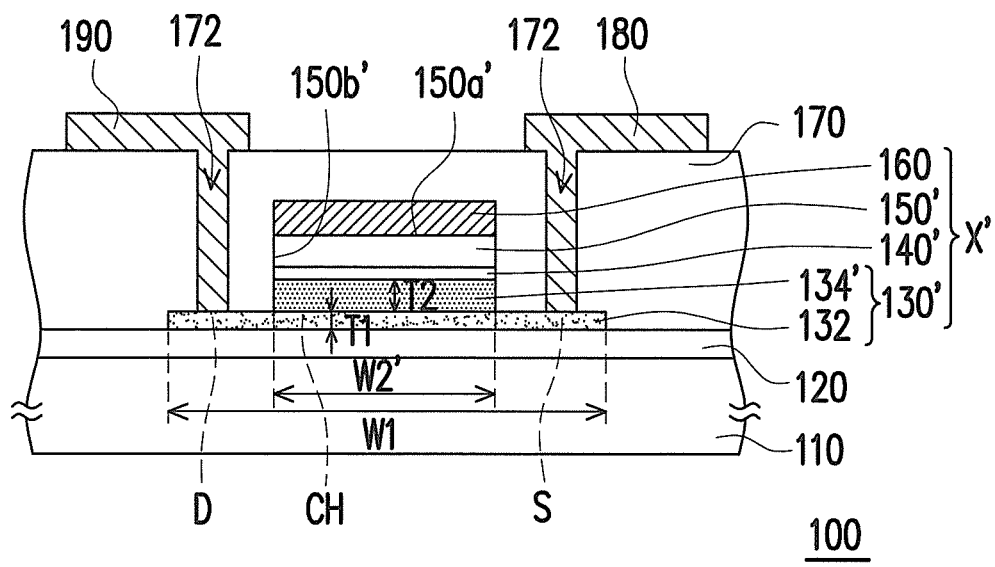

Referring to FIG. 1E, afterwards, a source 180 and a drain 190 are formed on the dielectric layer 170, in which the source 180 and the drain 190 are filled into the contact openings 172, so as to electrically connect with the semiconductor stacked layer 130', thereby forming the thin-film transistor 100. More specifically, the source 180 and the drain 190 contact the first metal oxide semiconductor layer 132 of the semiconductor stacked layer 130' through the contact openings 172. The source 180 and the drain 190 are formed by, for example, depositing a metal material (not illustrated), and followed by performing a photolithography process and an etching process to pattern the metal material.

It can be known from the FIG. 1E that, the thin film transistor 100 according to the invention includes the semiconductor stacked layer 130', the insulating layer 150', the gate 160, the dielectric layer 170, the source 180 and the drain 190. The semiconductor stacked layer 130' includes the first metal oxide semiconductor layer 132 and the second metal oxide semiconductor layer 134' disposed on the first metal oxide semiconductor layer 132, in which the resistance value of the first metal oxide semiconductor layer 132 is less than a resistance value of the second metal oxide semiconductor layer 134'. The insulating layer 150' is disposed on the semiconductor stacked layer 130'. The gate 160 is disposed on the insulating layer 150'. The dielectric layer 170 covers the gate 160, in which the dielectric layer 170 has a plurality of contact openings 172. The source 180 and the drain 190 are disposed on the dielectric layer 170, and filled into the contact openings 172 to electrically connect with the semiconductor stacked layer 130'. Moreover, the thin film transistor 100 according to the invention can further include the protection layer 140' which is disposed between the semiconductor stacked layer 130' and the insulating layer 150'. It should be noted that in the present embodiment, a thickness T1 of the first metal oxide semiconductor layer 132 is less than a thickness T2 of the second metal oxide semiconductor layer 134'. A width W2' of the second metal oxide semiconductor layer 134' is less than a width W1 of the first metal oxide semiconductor layer 132, so as to partially expose the first metal oxide semiconductor layer 132, and the source 180 and the drain 190 contact the exposed first metal oxide semiconductor layer 132 through the contact openings 172. Thus, in the present embodiment, a source region S and a drain region D are formed in a partial of the first metal oxide semiconductor layer 132 by a self-alignment which uses the gate 160 as a mask, a channel region CH is located in the second metal oxide semiconductor layer 134'. Furthermore, in the present embodiment, the gate 160 covers an upper surface 150a' of the insulating layer 150', and exposes a lateral surface 150b' of the insulating layer 150'.

In the first embodiment of the invention, the width W2' of the second metal oxide semiconductor layer 134' is less than the width W1 of the first metal oxide semiconductor layer 132. However, the invention is not limited thereto. In other embodiments of the invention (e.g., the second embodiment through the third embodiment), the width W2' of the second metal oxide semiconductor layer 134' can be equal to the width W1 of the first metal oxide semiconductor layer 132. Hereinafter, the second embodiment through the third embodiment of the invention are described in detail, said embodiments are similar to the first embodiment depicted in FIG. 1E, thus identical elements are indicated by the same reference numbers, and the descriptions thereof are not repeated.

Figure 2A:
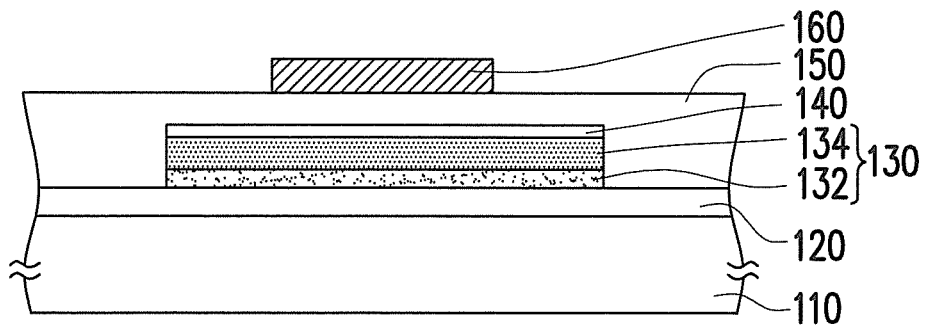
FIGS. 2A to 2D are schematic cross-sectional views illustrating a fabricating method of a thin film transistor according to a second embodiment of the invention.

FIGS. 2A to 2D are schematic cross-sectional views illustrating a fabricating method of a thin film transistor 200 according to a second embodiment of the invention. First, a structure as shown in FIG. 2A is formed, and said structure and a fabricating method thereof are identical to that of FIG. 1B, thus identical elements are indicated by the same reference numbers, and the descriptions thereof are not repeated.

Figure 2B:
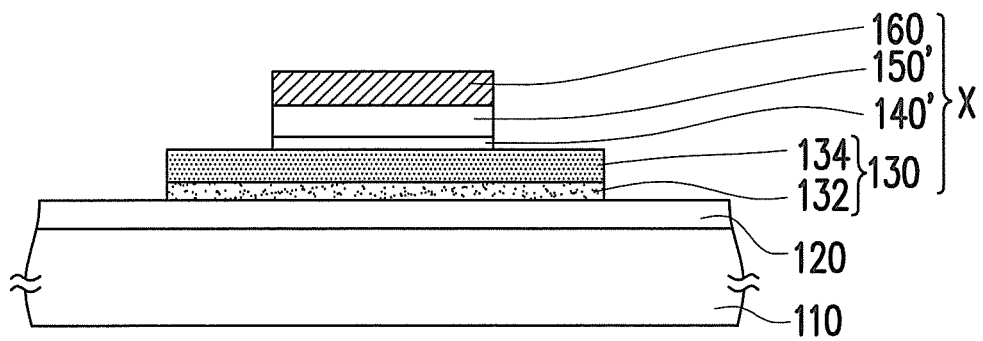

Referring to FIG. 2B, subsequently, the insulating material 150 and the protection layer 140 are patterned by using the gate 160 as an etching mask, so as to partially expose the second metal oxide semiconductor material, thereby forming the semiconductor stacked layer 130. The semiconductor stacked layer 130 includes a first metal oxide semiconductor layer 132 and a second metal oxide semiconductor layer 134 disposed on the first metal oxide semiconductor layer 132. Further, a protection layer 140' and an insulating layer 150' are formed on the semiconductor stacked layer 130, and the gate 160 is formed on the insulating layer 150'. Therein, the semiconductor stacked layer 130, the protection layer 140', the insulating layer 150' and the gate 160 are a stacked layer X.

Figure 2C:
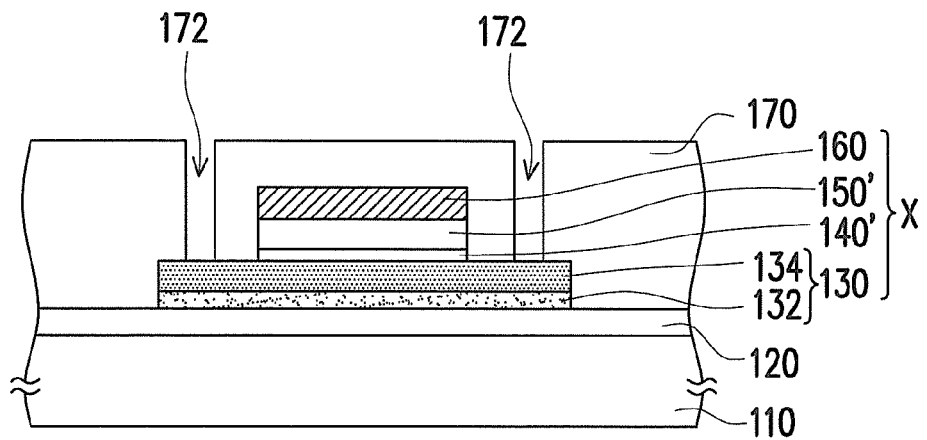

Referring to FIG. 2C, thereafter, a dielectric layer 170 is formed on the stacked layer X, in which the dielectric layer 170 has a plurality of contact openings 172. More specifically, the dielectric layer 170 completely covers an upper side and a lateral side the stack layer X and the buffer layer 120 being exposed, and the second metal oxide semiconductor layer 134 of the semiconductor stacked layer 130 is partially exposed by the contact openings 172 in the dielectric layer 170.

Figure 2D:
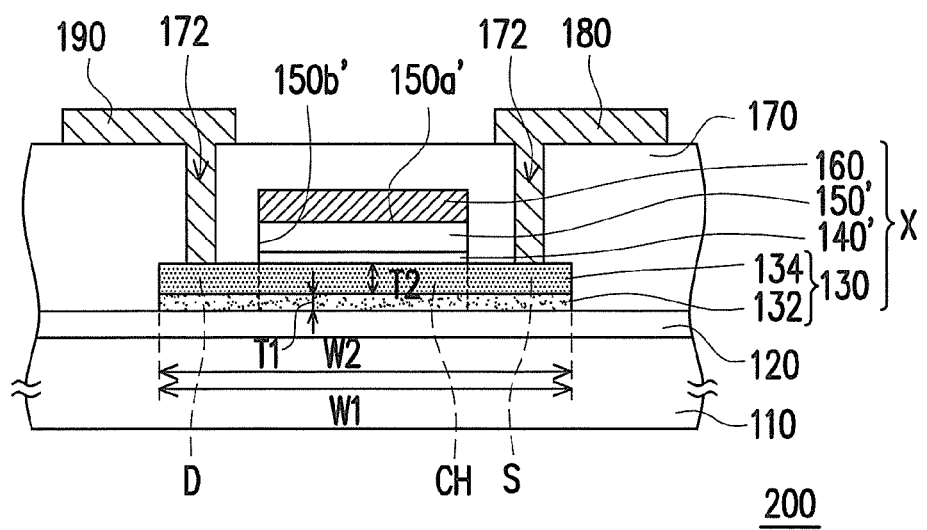

Referring to FIG. 2D, afterwards, a source 180 and a drain 190 are formed on the dielectric layer 170, in which the source 180 and the drain 190 are filled into the contact openings 172, so as to electrically connect with the semiconductor stacked layer 130, thereby forming the thin-film transistor 200. More specifically, the source 180 and the drain 190 contact the second metal oxide semiconductor layer 134 of the semiconductor stacked layer 130 through the contact openings 172.

It can be known from the FIG. 2D that, the thin film transistor 200 according to the invention includes the semiconductor stacked layer 130, the insulating layer 150', the gate 160, the dielectric layer 170, the source 180 and the drain 190. The semiconductor stacked layer 130 includes a first metal oxide semiconductor layer 132 and a second metal oxide semiconductor layer 134 disposed on the first metal oxide semiconductor layer 132, in which a resistance value of the first metal oxide semiconductor layer 132 is less than a resistance value of the second metal oxide semiconductor layer 134. The insulating layer 150' is disposed on the semiconductor stacked layer 130. The gate 160 is disposed on the insulating layer 150'. The dielectric layer 170 covers the gate 160, in which the dielectric layer 170 has a plurality of contact openings 172. The source 180 and the drain 190 are disposed on the dielectric layer 170, and filled into the contact openings 172 to electrically connect with the semiconductor stacked layer 130. Moreover, the thin film transistor 200 according to the invention can further include the protection layer 140' which is disposed between the semiconductor stacked layer 130 and the insulating layer 150'. It should be noted that in the present embodiment, a thickness T1 of the first metal oxide semiconductor layer 132 is less than a thickness T2 of the second metal oxide semiconductor layer 134. A width W2 of the second metal oxide semiconductor layer 134 is equal to a width W1 of the first metal oxide semiconductor layer 132, and the source 180 and the drain 190 contact the second metal oxide semiconductor layer 134 through the contact openings 172. Thus, in the present embodiment, a source region S and a drain region D are formed in a partial of the second metal oxide semiconductor layer 134 by a self-alignment which uses the gate 160 as a mask, a channel region CH is a partial of the second metal oxide semiconductor layer 134 disposed under the gate 160. Furthermore, in the present embodiment, the gate 160 covers an upper surface 150a' of the insulating layer 150', and exposes a lateral surface 150b' of the insulating layer 150'.

Figure 3A:
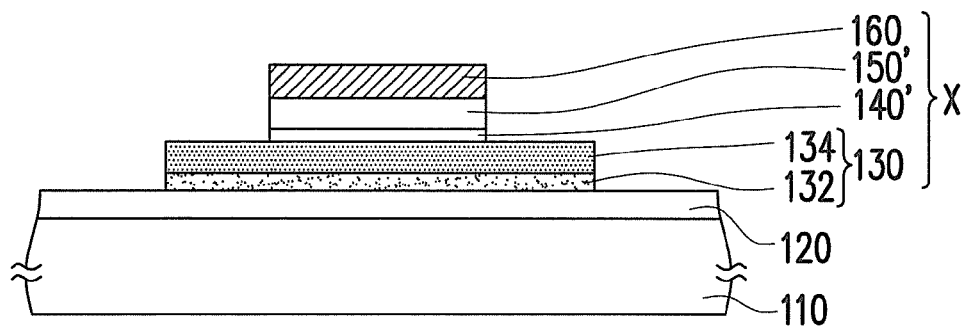
FIGS. 3A to 3C are schematic cross-sectional views illustrating a fabricating method of a thin film transistor according to a third embodiment of the invention.
Figure 3B:
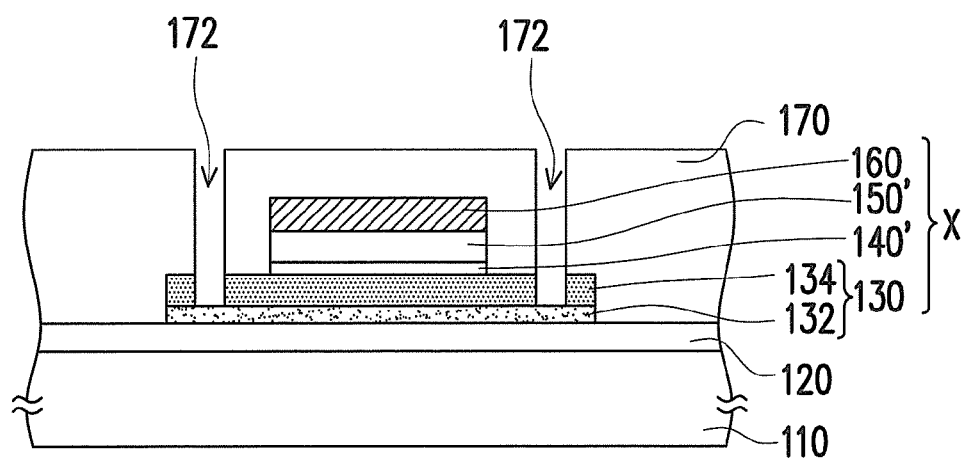
Figure 3C:
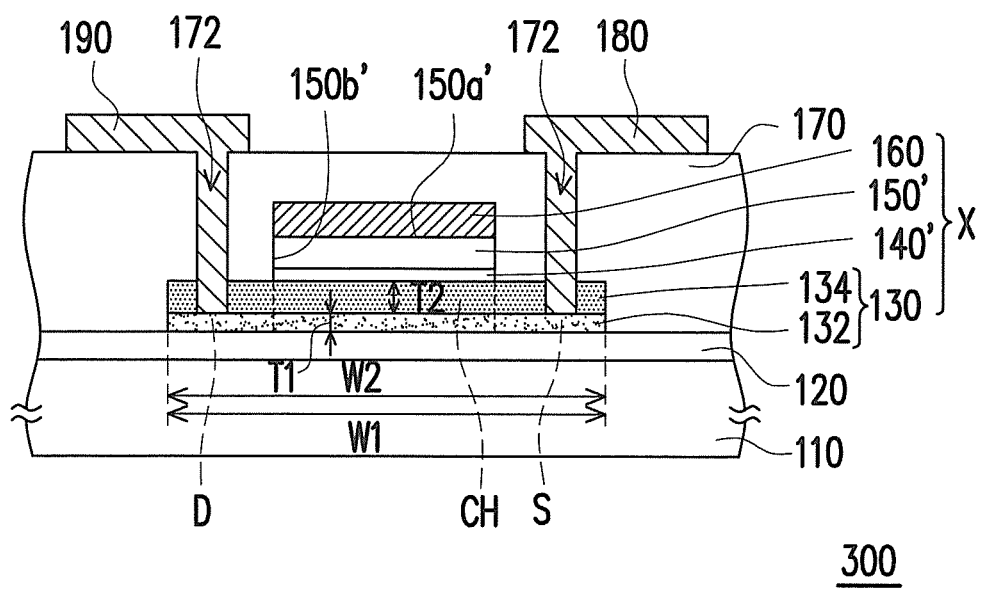

FIGS. 3A to 3C are schematic cross-sectional views illustrating a fabricating method of a thin film transistor 300 according to a third embodiment of the invention. First, a structure as shown in FIG. 3A is formed, and said structure and a fabricating method thereof are identical to that of FIG. 2B, thus identical elements are indicated by the same reference numbers, and the descriptions thereof are not repeated.

Referring to FIG. 3B, thereafter, a dielectric layer 170 is formed on the stacked layer X, in which the dielectric layer 170 has a plurality of contact openings 172. More specifically, the dielectric layer 170 completely covers an upper side and a lateral side the stack layer X and the buffer layer 120 being exposed, and the contact openings 172 in the dielectric layer 170 further penetrate the second metal oxide semiconductor layer 134 of the semiconductor stacked layer 130, so as to partially expose the first metal oxide semiconductor layer 132 of the semiconductor stacked layer 130.

Referring to FIG. 3C, afterwards, a source 180 and a drain 190 are formed on the dielectric layer 170, in which the source 180 and the drain 190 are filled into the contact openings 172, so as to electrically connect with the semiconductor stacked layer 130, thereby forming the thin-film transistor 300. More specifically, the source 180 and the drain 190 contact the first metal oxide semiconductor layer 132 of the semiconductor stacked layer 130 through the contact openings 172.

It can be known from the FIG. 3C that, the thin film transistor 300 according to the invention includes the semiconductor stacked layer 130, the insulating layer 150', the gate 160, the dielectric layer 170, the source 180 and the drain 190. The semiconductor stacked layer 130 includes a first metal oxide semiconductor layer 132 and a second metal oxide semiconductor layer 134 disposed on the first metal oxide semiconductor layer 132, in which a resistance value of the first metal oxide semiconductor layer 132 is less than a resistance value of the second metal oxide semiconductor layer 134. The insulating layer 150' is disposed on the semiconductor stacked layer 130. The gate 160 is disposed on the insulating layer 150'. The dielectric layer 170 covers the gate 160, in which the dielectric layer 170 has a plurality of contact openings 172. The source 180 and the drain 190 are disposed on the dielectric layer 170, and filled into the contact openings 172 to electrically connect with the semiconductor stacked layer 130. Moreover, the thin film transistor 300 according to the invention can further include the protection layer 140' which is disposed between the semiconductor stacked layer 130 and the insulating layer 150'. It should be noted that in the present embodiment, a thickness T1 of the first metal oxide semiconductor layer 132 is less than a thickness T2 of the second metal oxide semiconductor layer 134. A width W2 of the second metal oxide semiconductor layer 134 is equal to a width W1 of the first metal oxide semiconductor layer 132, the contact openings 172 penetrate the second metal oxide semiconductor layer 134, and the source 180 and the drain 190 contact the first metal oxide semiconductor layer 132 through the contact openings 172. Thus, in the present embodiment, a source region S and a drain region D are formed in a partial of the first metal oxide semiconductor layer 132 by a self-alignment which uses the gate 160 as a mask, a channel region CH is a partial of the second metal oxide semiconductor layer 134 disposed under the gate 160. Furthermore, in the present embodiment, the gate 160 covers an upper surface 150*a*' of the insulating layer 150', and exposes a lateral surface 150*b*' of the insulating layer 150'.

Figure 4A:
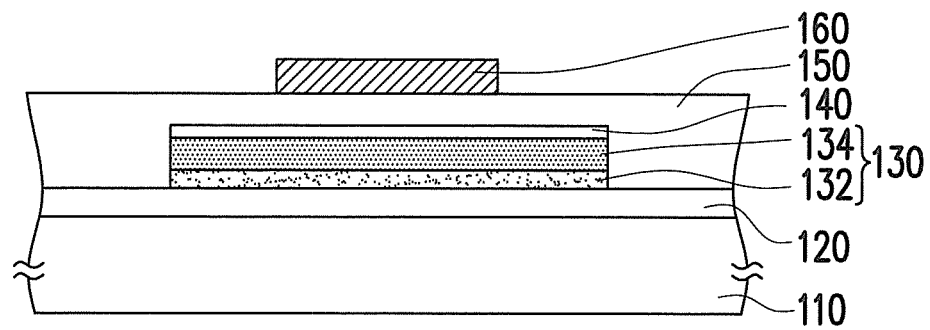
FIGS. 4A to 4D are schematic cross-sectional views illustrating a fabricating method of a thin film transistor according to a fourth embodiment of the invention.

FIGS. 4A to 4D are schematic cross-sectional views illustrating a fabricating method of a thin film transistor 400 according to a fourth embodiment of the invention. First, a structure as shown in FIG. 4A is formed, and said structure and a fabricating method thereof are identical to that of FIG. 1B, thus identical elements are indicated by the same reference numbers, and the descriptions thereof are not repeated.

Figure 4B:
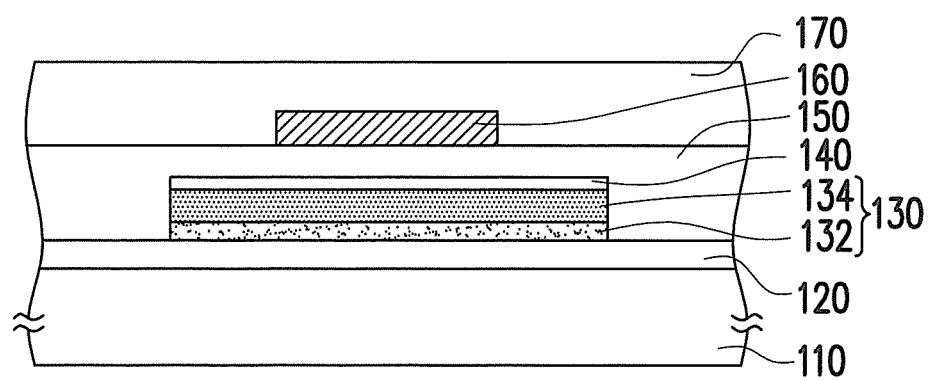

Referring to FIG. 4B, subsequently, a dielectric layer 170 is formed on a gate 160 and an insulating material 150. More specifically, the dielectric layer 170 covers an upper side and a lateral side of the gate 160 and the insulating material 150 being exposed.

Figure 4C:
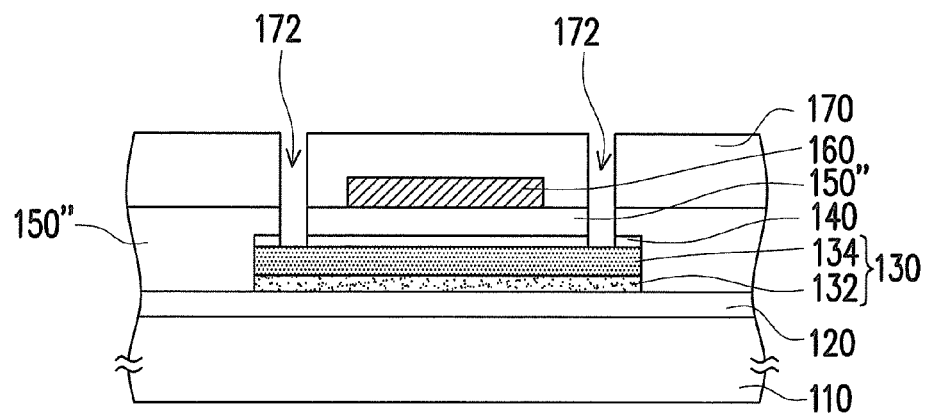

Referring to FIG. 4C, a plurality of contact openings 172 is formed in the dielectric layer 170. The method of forming the contact openings 172 includes, for example, performing a photolithography process and an etching process. The contact openings 172 in the dielectric layer 170 penetrate the insulating material 150 and the protection layer 140, so as to partially expose the second metal oxide semiconductor layer 134 of the semiconductor stacked layer 130. Hereinafter, the insulating material 150 penetrated by the contact openings 172 is known as an insulating layer 150".

Figure 4D:
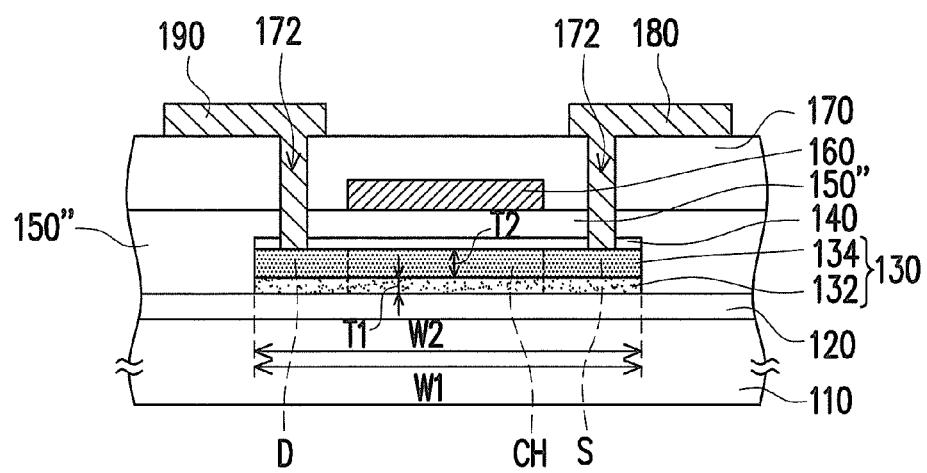

Referring to FIG. 4D, afterwards, a source 180 and a drain 190 are formed on the dielectric layer 170, in which the source 180 and the drain 190 are filled into the contact openings 172, so as to electrically connect with the semiconductor stacked layer 130, thereby forming the thin-film transistor 400. More specifically, the source 180 and the drain 190 contact the second metal oxide semiconductor layer 134 of the semiconductor stacked layer 130 through the contact openings 172.

It can be known from the FIG. 4D that, the thin film transistor 400 according to the invention includes the semiconductor stacked layer 130, the insulating layer 150", the gate 160, the dielectric layer 170, the source 180 and the drain 190. The semiconductor stacked layer 130 includes a first metal oxide semiconductor layer 132 and a second metal oxide semiconductor layer 134 disposed on the first metal oxide semiconductor layer 132, in which a resistance value of the first metal oxide semiconductor layer 132 is less than a resistance value of the second metal oxide semiconductor layer 134. The insulating layer 150" is disposed on the semiconductor stacked layer 130. The gate 160 is disposed on the insulating layer 150". The dielectric layer 170 covers the gate 160 and the insulating layer 150", in which the dielectric layer 170 has a plurality of contact openings 172. The source 180 and the drain 190 are disposed on the dielectric layer 170, and filled into the contact openings 172 to electrically connect with the semiconductor stacked layer 130. Moreover, the thin film transistor 400 according to the invention can further include the protection layer 140 which is disposed between the semiconductor stacked layer 130 and the insulating layer 150". It should be noted that in the present embodiment, a thickness T1 of the first metal oxide semiconductor layer 132 is less than a thickness T2 of the second metal oxide semiconductor layer 134. A width W2 of the second metal oxide semiconductor layer 134 is equal to a width W1 of the first metal oxide semiconductor layer 132, and the source 180 and the drain 190 contact the second metal oxide semiconductor layer 134 through the contact openings 172. Thus, in the present embodiment, a source region S and a drain region D are formed in a partial of the second metal oxide semiconductor layer 134 by a self-alignment which uses the gate 160 as a mask, a channel region CH is a partial of the second metal oxide semiconductor layer 134 disposed under the gate 160. Furthermore, in the present embodiment, the insulating layer 150" covers the semiconductor stacked layer 130, and the dielectric layer 170 covers the gate 160 and the insulating layer 150".

Figure 5A:
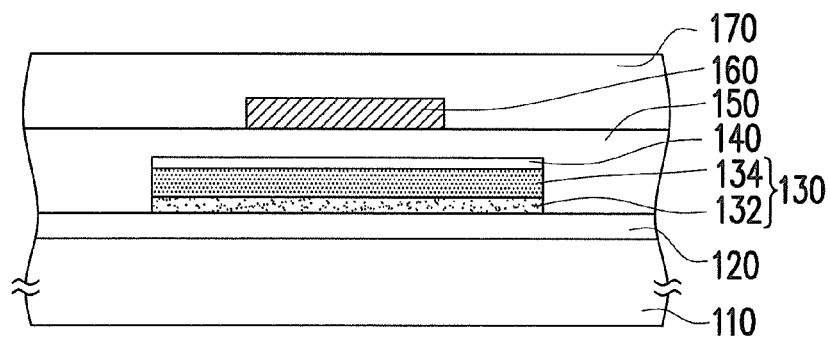
FIGS. 5A to 5C are schematic cross-sectional views illustrating a fabricating method of a thin film transistor according to a fifth embodiment of the invention.
Figure 5B:
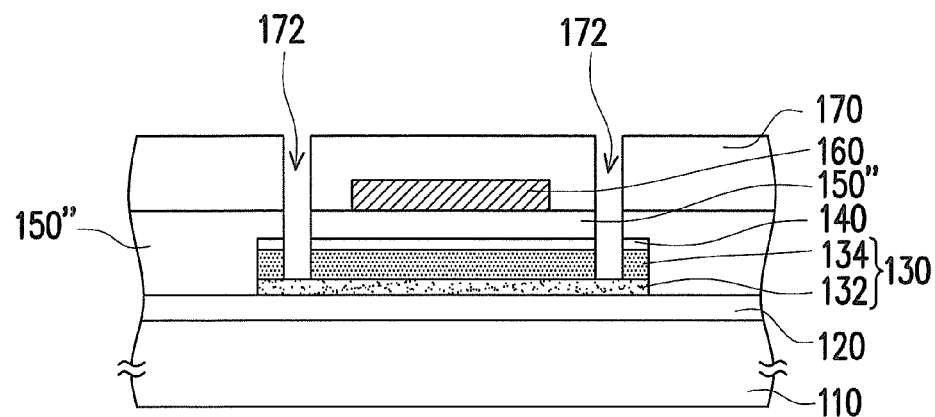
Figure 5C:
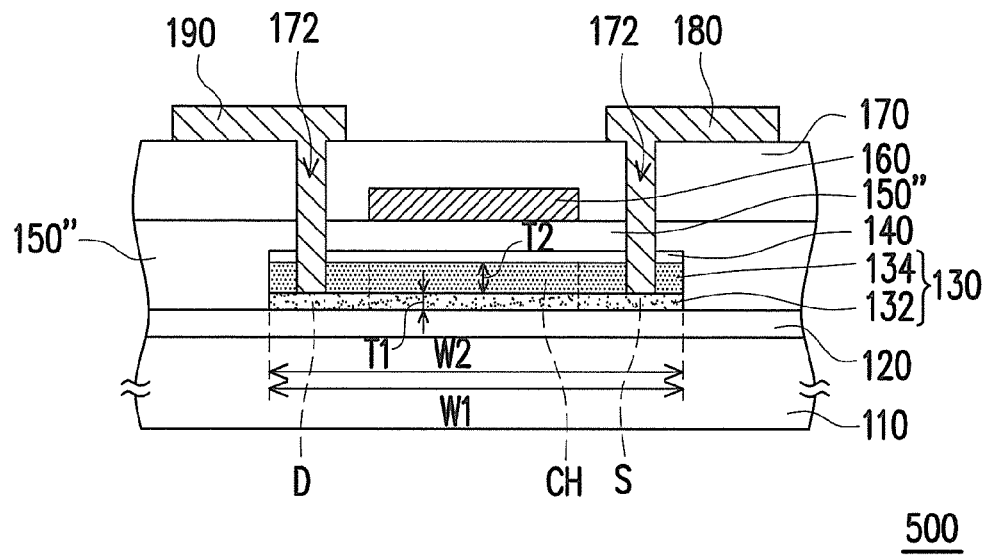

FIGS. 5A to 5C are schematic cross-sectional views illustrating a fabricating method of a thin film transistor 500 according to a fifth embodiment of the invention. First, a structure as shown in FIG. 5A is formed, and said structure and a fabricating method thereof are identical to that of FIG. 4B, thus identical elements are indicated by the same reference numbers, and the descriptions thereof are not repeated.

Referring to FIG. 5B, a plurality of contact openings 172 is formed in the dielectric layer 170. The contact openings 172 in the dielectric layer 170 penetrate the insulating material 150, the protection layer 140 and the second metal oxide semiconductor layer 134 of the semiconductor stacked layer 130, so as to partially expose the first metal oxide semiconductor layer 132 of the semiconductor stacked layer 130. Hereinafter, the insulating material 150 penetrated by the contact openings 172 is known as an insulating layer 150".

Referring to FIG. 5C, afterwards, a source 180 and a drain 190 are formed on the dielectric layer 170, in which the source 180 and the drain 190 are filled into the contact openings 172, so as to electrically connect with the semiconductor stacked layer 130, thereby forming the thin-film transistor 500. More specifically, the source 180 and the drain 190 contact the first metal oxide semiconductor layer 132 of the semiconductor stacked layer 130 through the contact openings 172.

It can be known from the FIG. 5C that, the thin film transistor 500 according to the invention includes the semiconductor stacked layer 130, the insulating layer 150", the gate 160, the dielectric layer 170, the source 180 and the drain 190. The semiconductor stacked layer 130 includes a first metal oxide semiconductor layer 132 and a second metal oxide semiconductor layer 134 disposed on the first metal oxide semiconductor layer 132, in which a resistance value of the first metal oxide semiconductor layer 132 is less than a resistance value of the second metal oxide semiconductor layer 134. The insulating layer 150" is disposed on the semiconductor stacked layer 130. The gate 160 is disposed on the insulating layer 150". The dielectric layer 170 covers the gate 160 and the insulating layer 150", in which the dielectric layer 170 has a plurality of contact openings 172. The source 180 and the drain 190 are disposed on the dielectric layer 170, and filled into the contact openings 172 to electrically connect with the semiconductor stacked layer 130. Moreover, the thin film transistor 500 according to the invention can further include the protection layer 140 which is disposed between the semiconductor stacked layer 130 and the insulating layer 150". It should be noted that in the present embodiment, a thickness T1 of the first metal oxide semiconductor layer 132 is less than a thickness T2 of the second metal oxide semiconductor layer 134. A width W2 of the second metal oxide semiconductor layer 134 is equal to a width W1 of the first metal oxide semiconductor layer 132, the contact openings 172 penetrate the second metal oxide semiconductor layer 134, and the source 180 and the drain 190 contact the first metal oxide semiconductor layer 132 through the contact openings 172. Thus, in the present embodiment, a source region S and a drain region D are formed in a partial of the first metal oxide semiconductor layer 132 by a self-alignment which uses the gate 160 as a mask, a channel region CH is a partial of the second metal oxide semiconductor layer 134 disposed under the gate 160. Furthermore, in the present embodiment, the insulating layer 150" covers the semiconductor stacked layer 130, and the dielectric layer 170 covers the gate 160 and the insulating layer 150".

The foregoing embodiments all include the protection layer 140 (140') for example, however, in other embodiment of the invention, depending on design, the protection layer 140 (140') may not be necessary, and the invention is not limited thereto.

Figure 6:
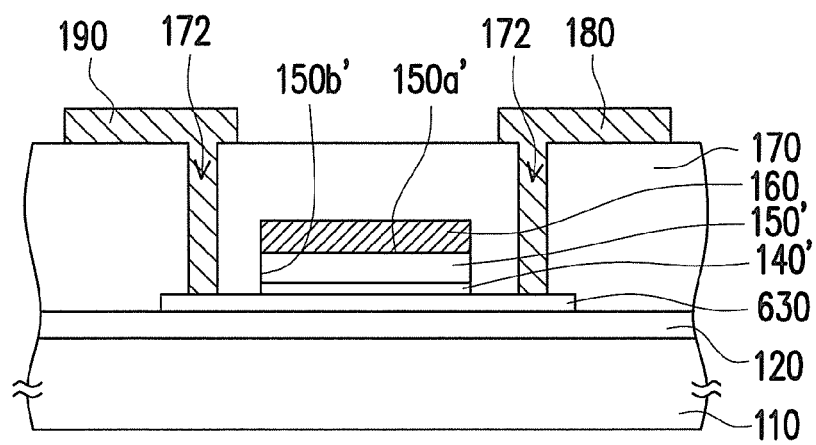
FIG. 6 is a schematic cross-sectional view of a thin film transistor of a comparison example.

In order to prove that a design of the thin film transistor with the self-align top-gate structure provided by the invention does have a better characteristic, an experimental example is further provided. FIG. 6 is a schematic cross-sectional view of a thin film transistor 600 for comparison examples 1 to 2, in which a semiconductor layer 630 in comparison example 1 is indium gallium zinc (IGZO), and the semiconductor 630 in comparison example 2 is indium tin zinc oxide (ITZO). A structure depicted in FIG. 6 and a fabricating method thereof is similar to that of FIG. 1E, thus identical elements are indicated by the same reference numbers, and the descriptions thereof are not repeated. The experimental example utilizes the structure of the thin film transistor 100 depicted in FIG. 1E, in which the second metal oxide semiconductor layer 134' is indium gallium zinc (IGZO), and the first metal oxide semiconductor layer 132 is indium tin zinc oxide (ITZO).

Figure 7:
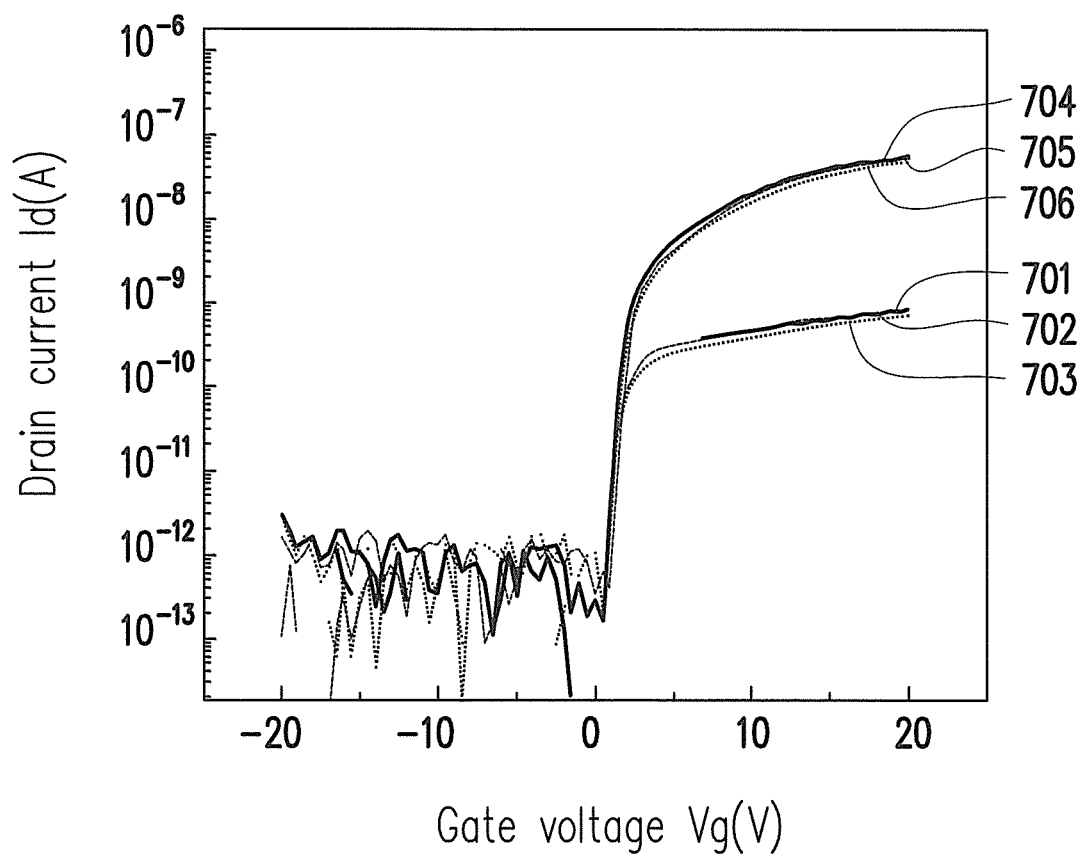
FIG. 7 is a curve diagram of drain current-gate voltage of a thin film transistor in comparison example 1.

FIG. 7 are curve diagrams of drain current-gate voltage (Id-Vg) of a thin film transistor in comparison example 1. In FIG. 7, a drain voltage (Vd) for curves 701 to 703 is 0.1V, and the drain voltage for curves 704 to 706 is 10V. Further, a channel width for the curves 701 to 706 is 15 micrometers; a channel length for the curve 701 and the curve 704 is 5 micrometers; the channel length for the curve 702 and the curve 705 is 10 micrometers; and the channel length for the curve 703 and the curve 706 is 15 micrometers. In comparison example 1, since the semiconductor layer 630 is the indium gallium zinc (IGZO), a partial of the semiconductor layer 630 under the gate 160 is served as a channel region and source region and drain region are not provided. It can be known from FIG. 7 that, since a resistance value of regions other than the channel region is overly high, a drain current thereof is relatively lower (approximately $10^{-10}$~$10^{-7}$A).

Figure 8:
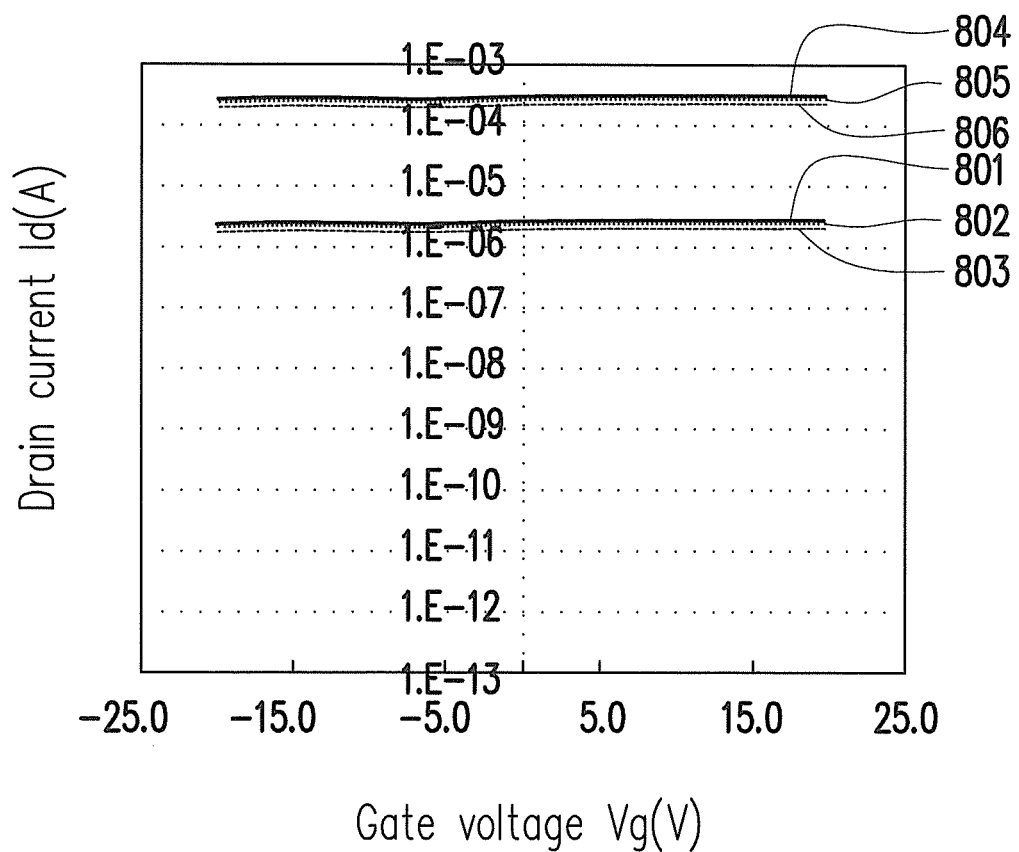
FIG. 8 is a curve diagram of drain current-gate voltage of a thin film transistor in comparison example 2.

FIG. 8 are curve diagrams of drain current-gate voltage of a thin film transistor in comparison example 2. In FIG. 8, the channel width and the channel length for curves 801 to 806 are all 5 micrometers; the drain voltage for the curves 801 to 803 is 0.1V; and the drain voltage for the curves 804 to 806 is 10V. Further, the width of the semiconductor layer other than the channel region for the curves 801 and 804 is 1 micrometer; the width of the semiconductor layer other than the channel region for the curves 802 and 805 is 1.5 micrometers; and the width of the semiconductor layer other than the channel region for the curves 803 and 806 is 2 micrometers. In comparison example 2, since the semiconductor layer 630 is indium tin zinc oxide (ITZO), a partial of the semiconductor layer 630 under the gate 160 is served as a channel region and two lateral sides thereof are served as the source region and the drain region. It can be known from FIG. 8 that, since a resistance value of the regions other than the channel region is overly low, the channel region cannot be closed. More specifically, when the gate voltage is changed, the drain current cannot be adjusted accordingly and maintains at approximately 1.E-06 to 1.E-03A, thus the device is continuously being turned on and cannot be turned off.

Figure 9:
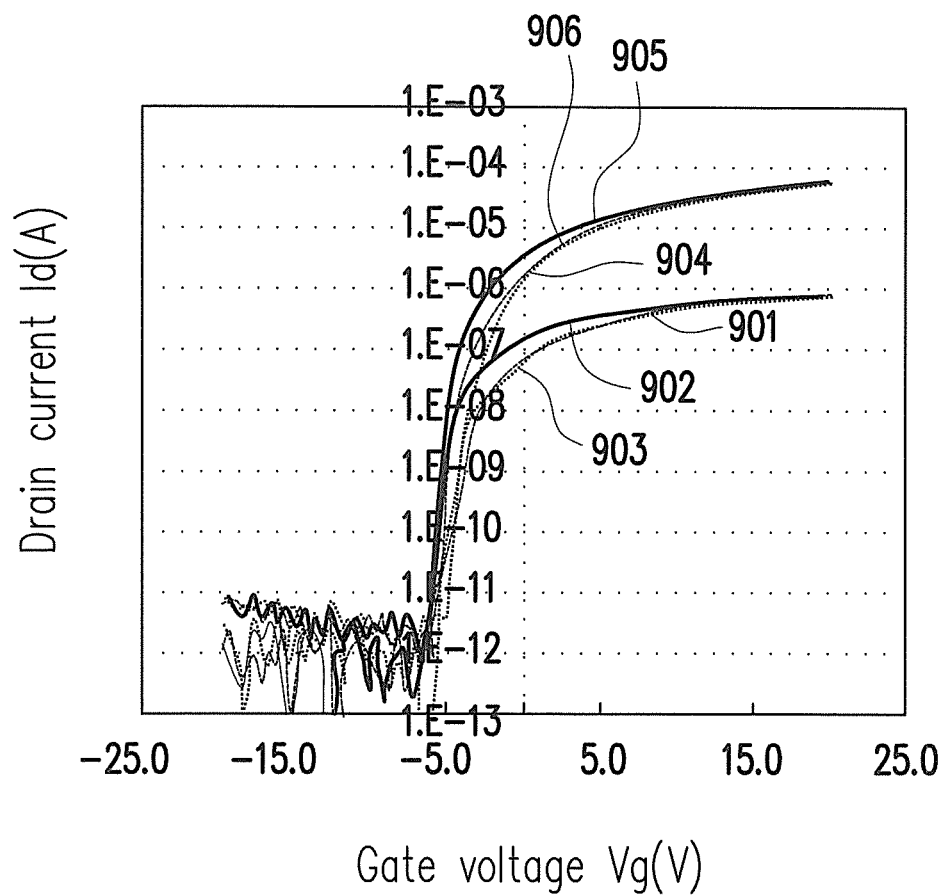
FIG. 9 is a curve diagram of drain current-gate voltage of a thin film transistor of an experimental example.

FIG. 9 are curve diagrams of drain current-gate voltage of a thin film transistor of an experimental example of the present invention. In FIG. 9, the channel width and the channel length for curves 901 to 906 are all 5 micrometers; the drain voltage for the curves 901 to 903 is 0.1V; and the drain voltage for the curves 904 to 906 is 10V. Further, the width of the semiconductor stacked layer other than the channel region for the curves 901 and 904 is 1 micrometer; the width of the semiconductor stacked layer other than the channel region for the curves 902 and 905 is 1.5 micrometers; and the width of the semiconductor stacked layer other than the channel region for the curves 903 and 906 is 2 micrometers. In the experimental example, the thin film transistor includes the indium gallium zinc (IGZO) layer and the indium tin zinc oxide (ITZO) layer which are continuously stacked, thus the indium tin zinc oxide (ITZO) layer can be utilized as the source region and the drain region, and the gate can smoothly prevent the indium gallium zinc (IGZO) layer from being affected by the underlying indium tin zinc oxide (ITZO) layer, such that a better device characteristic can be provided. In view of FIG. 9, the experimental example has a better drain current (approximately 1.E-07 to 1.E-04A) than that in FIG. 7 but without the problem in turning off the device.

In summary, in the thin film transistor and the fabricating method thereof, the semiconductor stacked layer includes a first metal oxide semiconductor layer and a second metal oxide semiconductor layer disposed on the first metal oxide semiconductor layer, in which a resistance value of the first metal oxide semiconductor layer is less than a resistance value of the second metal oxide semiconductor layer. In other words, the thin film transistor has two metal oxide semiconductor layers which are sequentially stacked, and the resistance value of the metal oxide semiconductor layer on lower layer is less than the resistance value of the metal oxide semiconductor layer on upper layer. Furthermore, the thin film transistor with the self-align top-gate structure of the invention can be complete by using only a photolithography process without sputtering entire surface of the aluminum thin film and the oxidation reaction as in the conventional art. Accordingly, the thin film transistor with the self-align top-gate structure and the fabricating method thereof according to the invention can solve the problems in the conventional art such as difficulties in controlling the thickness of the aluminum thin film and the oxidation reaction with non-uniformity, such that a more preferable device characteristic can be provided.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A thin film transistor, comprising:
a semiconductor stacked layer including a first metal oxide semiconductor layer and a second metal oxide semiconductor layer disposed on an upper surface of the first metal oxide semiconductor layer, and the upper surface of the first metal oxide semiconductor layer is an interface between the first metal oxide semiconductor layer and the second metal oxide semiconductor layer, wherein a resistance value of the first metal oxide semiconductor layer is less than a resistance value of the second metal oxide semiconductor layer;
an insulating layer disposed on the semiconductor stacked layer;
a gate disposed on the insulating layer;
a dielectric layer covering the gate, wherein the dielectric layer has a plurality of contact openings that expose a portion of the upper surface of the first metal oxide semiconductor layer; and
a source and a drain, disposed on the dielectric layer and filled into the contact openings to electrically connect with the semiconductor stacked layer, wherein the source and the drain contact the exposed portion of the upper surface of the first metal oxide semiconductor layer through the contact openings.

2. The thin film transistor of claim 1, wherein the first metal oxide semiconductor layer includes indium tin zinc oxide (ITZO), and the second metal oxide semiconductor layer includes indium gallium zinc oxide (IGZO) or silicon-containing indium gallium zinc oxide (Si-IGZO).

3. The thin film transistor of claim 1, wherein a thickness of the first metal oxide semiconductor layer is less than a thickness of the second metal oxide semiconductor layer.

4. The thin film transistor of claim 1, wherein a width of the second metal oxide semiconductor layer is less than a width of the first metal oxide semiconductor layer, thereby a portion of the first metal oxide semiconductor layer is uncovered.

5. The thin film transistor of claim 1, wherein a width of the second metal oxide semiconductor layer is substantially identical to a width of the first metal oxide semiconductor layer.

6. The thin film transistor of claim 1, wherein a width of the second metal oxide semiconductor layer is substantially identical to a width of the first metal oxide semiconductor layer, the contact openings penetrate the second metal oxide semiconductor layer, and the source and the drain contact the first metal oxide semiconductor layer through the contact openings.

7. The thin film transistor of claim 1, wherein the gate covers an upper surface of the insulating layer and uncovers a lateral surface of the insulating layer.

8. The thin film transistor of claim 1, wherein the insulating layer covers the semiconductor stacked layer, and the dielectric layer covers the gate and the insulating layer.

9. The thin film transistor of claim 1, further comprising a protection layer disposed between the semiconductor stacked layer and the insulating layer.

10. The thin film transistor of claim 1, wherein an orthogonal projection of the contact openings is located within an orthogonal projection of the first metal oxide semiconductor layer.

11. The thin film transistor of claim 1, wherein the plurality of contact openings are formed only within the dielectric layer.

12. The thin film transistor of claim 1, wherein a first side wall of the first metal oxide semiconductor layer and a second side wall of the second metal oxide semiconductor layer are non-continuous surfaces, and the first side wall and the second side wall are located on a same side.

13. The thin film transistor of claim 1, wherein the second metal oxide semiconductor layer do not contact the source and the drain.

14. The thin film transistor of claim 1, wherein the source and drain do not cover any side wall of the first metal oxide semiconductor layer.

* * * * *